United States Patent
Jo (10) Patent No.: US 8,797,816 B2
(45) Date of Patent: Aug. 5, 2014

(54) SEMICONDUCTOR MEMORY APPARATUS AND BIT LINE EQUALIZING CIRCUIT

(75) Inventor: Mi Hyeon Jo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 249 days.

(21) Appl. No.: 13/341,369

(22) Filed: Dec. 30, 2011

(65) Prior Publication Data
US 2012/0327731 A1   Dec. 27, 2012

(30) Foreign Application Priority Data

Jun. 27, 2011  (KR) .................. 10-2011-0062447

(51) Int. Cl.
*G11C 7/00*  (2006.01)

(52) U.S. Cl.
USPC ........................................ 365/203; 365/204

(58) Field of Classification Search
USPC ................. 365/203, 204, 207, 210.1
See application file for complete search history.

(56) References Cited

U.S. PATENT DOCUMENTS

| | | | |
|---|---|---|---|
| 6,307,797 B1 * | 10/2001 | Fournel et al. | ........... 365/189.09 |
| 6,392,943 B2 * | 5/2002 | Fournel | ........... 365/189.15 |
| 7,542,362 B2 * | 6/2009 | Versen et al. | ........... 365/205 |

\* cited by examiner

*Primary Examiner* — Vanthu Nguyen
(74) *Attorney, Agent, or Firm* — William Park & Associates Patent Ltd.

(57) ABSTRACT

A semiconductor memory apparatus comprises bit line sense amplifier unit, and a pair of precharge elements coupled in series between a first bit line and a second bit line and having an asymmetrical contact resistance ratio.

14 Claims, 6 Drawing Sheets

SEMICONDUCTOR MEMORY APPARATUS AND BIT LINE EQUALIZING CIRCUIT

CROSS-REFERENCES TO RELATED APPLICATION

The present application claims priority under 35 U.S.C. §119(a) to Korean application number 10-2011-0062447, filed on Jun. 27, 2011, in the Korean Intellectual Property Office, which is incorporated herein by reference in its entirety as set forth in full.

BACKGROUND

1. Technical Field

The present invention relates to a semiconductor integrated circuit, and more particularly, to a semiconductor memory apparatus and a bit line equalizing circuit.

2. Related Art

In general, a semiconductor memory apparatus includes a plurality of memory cells coupled between a plurality of word lines and a plurality of bit lines. The bit line structure of the semiconductor memory apparatus may include a folded bit-line structure and an open bit-line structure. In particular, the open bit-line structure has been proposed to achieve a high integration of the semiconductor memory device.

In the folded bit-line structure, a bit line and a bit line bar are provided in a same cell mat. In the open bit-line structure, however, a bit line and a bit line bar exist in different cell mats.

Figure 1:
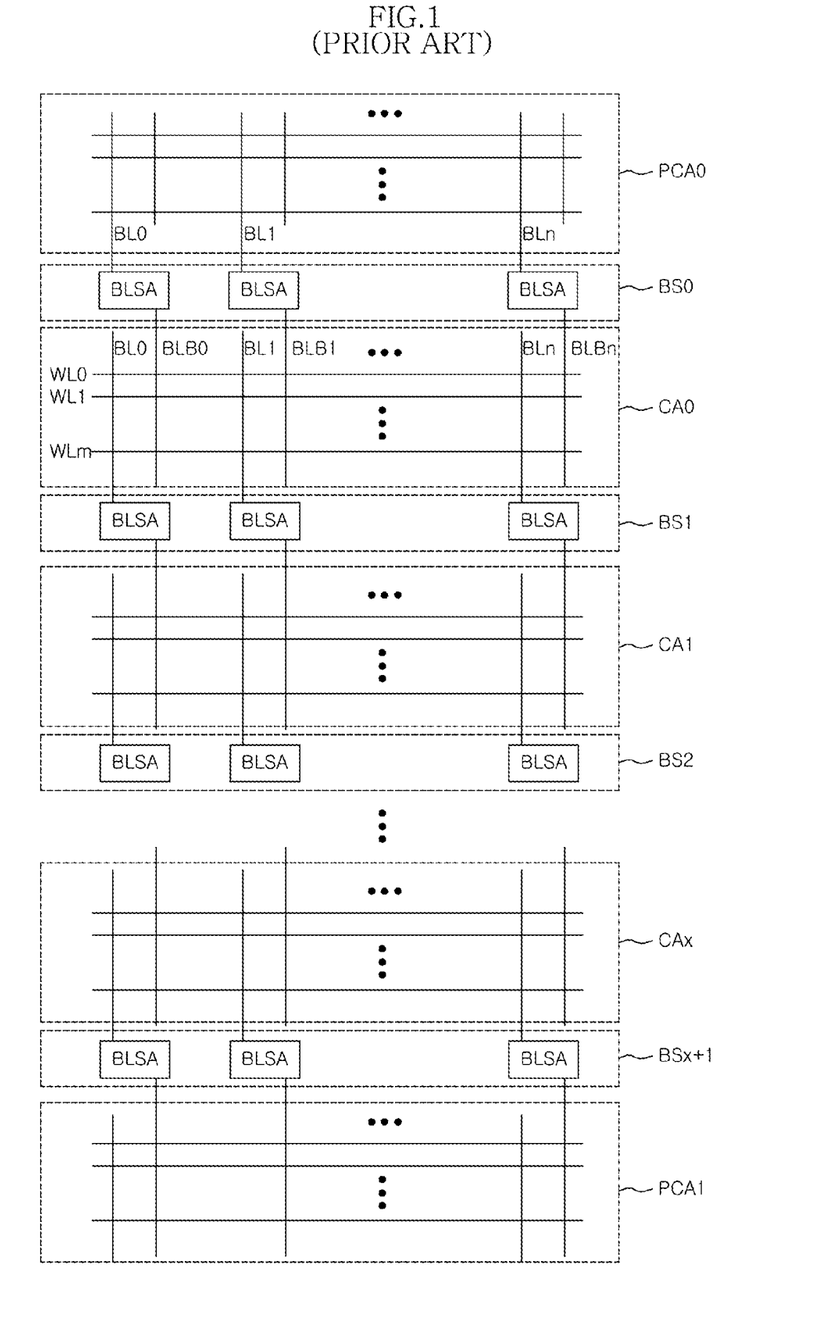
FIG. 1 illustrates a conventional semiconductor memory apparatus having an open bit-line structure.

FIG. 1 illustrates a conventional semiconductor memory apparatus having an open bit-line structure.

Referring to FIG. 1, the semiconductor memory apparatus having an open bit-line structure includes unit memory cell arrays CA0 to CAx and bit-line sense amplifier units BS0 to BSx+1 which are alternately arranged.

Each of the unit memory cell arrays CA0 to CAx includes a plurality of memory cells coupled between a plurality of word lines WL0 to WLm and a plurality of bit lines BL0 to BLn.

Furthermore, each of the bit-line sense amplifier units BS0 to BSx+1 is commonly coupled to bit lines BL0/BLB0 to BLn/BLBn coupled to two unit memory cell arrays adjacent to each other.

Accordingly, when a specific word line is selected and a bit is line crossing the selected word line is enabled, a bit line sense amplifier BLSA amplifies and outputs data stored in a corresponding memory cell according to a potential difference between the bit line coupled to the corresponding memory cell and a bit line bar existing in an adjacent cell mat.

In the semiconductor memory apparatus having an open bit-line structure, a bit line sense amplifier unit treats a bit line BL and a bit line bar BLB, which exist in different cell arrays, as one pair of bit lines when sensing data.

A designated number of unit memory cell arrays may be assumed to be one bank. In this case, the bit-line sense amplifier units BS0 and BSx+1 positioned at both edges of the bank are coupled to the bit lines or bit line bars of the memory cell arrays CA0 and CAx, respectively. However, bit line bars or bit lines forming one pair do not exist. Accordingly, sacrifice memory cell arrays PCA0 and PCA1 may be disposed at both edges of the bank such that the bit-line sense amplifier units BS0 and BSx+1 positioned at both edges of the bank perform a sensing operation.

Figure 2:
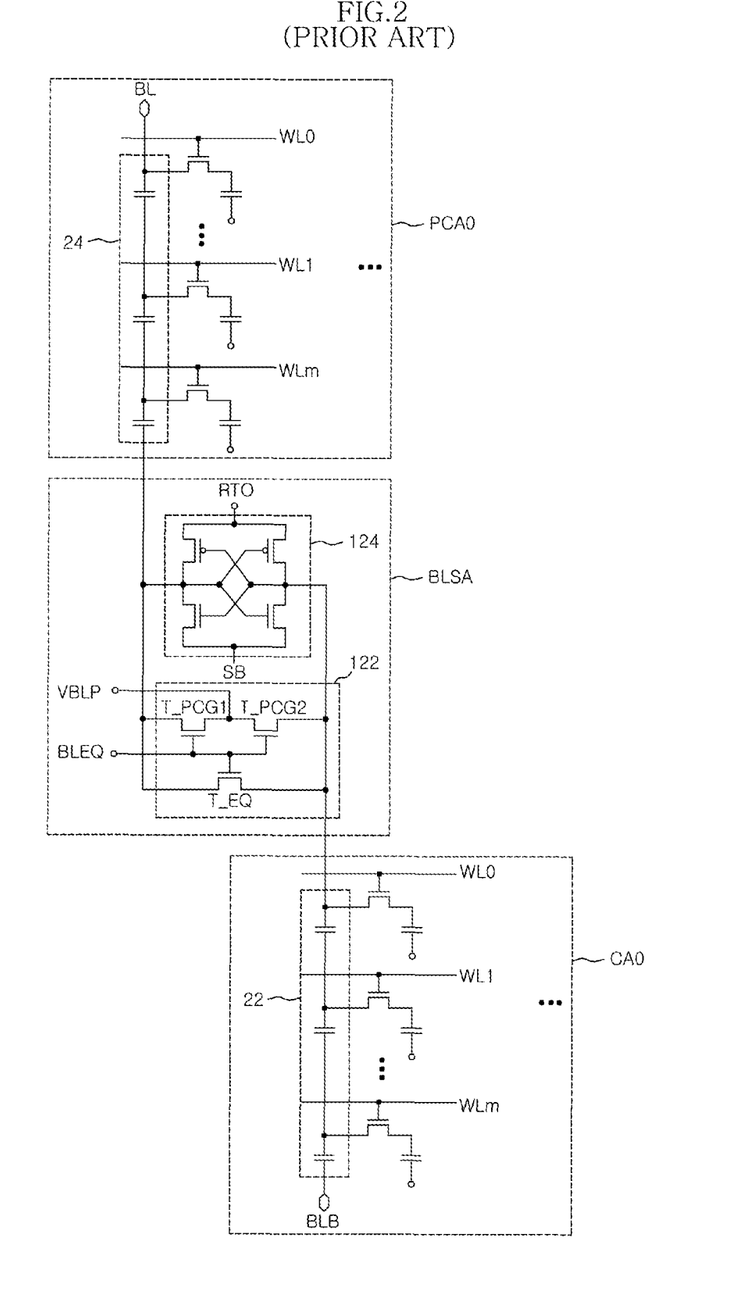
FIG. 2 is a diagram explaining an operation of a bit-line sense amplifier in a general open bit-line structure.

FIG. 2 is a diagram explaining the operation of a bit-line sense amplifier in a general open bit-line structure.

FIG. 2 illustrates the bit-line sense amplifier BLSA disposed at one edge between both edges of the bank and the sacrifice memory cell array PCA0 and the unit memory cell array CA0 which are coupled to the bit-line sense amplifier BLSA.

The sacrifice memory cell array PCA0 includes a plurality of memory cells coupled between the plurality of word lines WL0 to WLm and the plurality of bit lines BL0 to BLBn, like the unit memory cell array CA0 which is a main memory cell array.

The bit-line sense amplifier BLSA includes an equalizing circuit 122 and an amplification circuit 124. The equalizing circuit 122 is configured to precharge or equalize a bit line BL and a bit line bar BLB to a predetermined potential. The amplification circuit 124 is configured to sense and amplify the potential difference between the bit line BL and the bit line bar BLB.

The equalizing circuit 122 includes first and second precharge elements T_PCG1 and T_PCG2 and an equalizing element T_EQ. The first and second precharge elements T_PCG1 and T_PCG2 are configured to precharge the bit line BL and the bit line bar BLB to a precharge voltage VBLP in response to a bit line equalize signal BLEQ. The equalizing element T_EQ is configured to equalize the bit line BL and the bit line bar BLB to the precharge voltage VBLP in response to the bit line equalize signal BLEQ.

The amplification circuit 124 may be configured in a latch type coupled between the bit line pair BL/BLB, and amplifies the voltage level of the bit line pair BL/BLB using sense amplifier power signals RTO and SB outputted from a bit-line sense amplifier control circuit as a power supply source.

During the sensing operation, a parasitic capacitance component 22 exists in the memory cell array CA0. Since the sacrifice memory cell array PCA0 has the same structure as the memory cell array, a parasitic capacitance component 24 having the same value as the parasitic capacitance component 22 of the memory cell array CA0 also exists in the sacrifice memory cell array PCA0.

Accordingly, the parasitic capacitance components having the same value exist in the bit line pair BL/BLB coupled to the bit line sense amplifier BLSA such that the data of the memory cell is accurately sensed.

Figure 3:
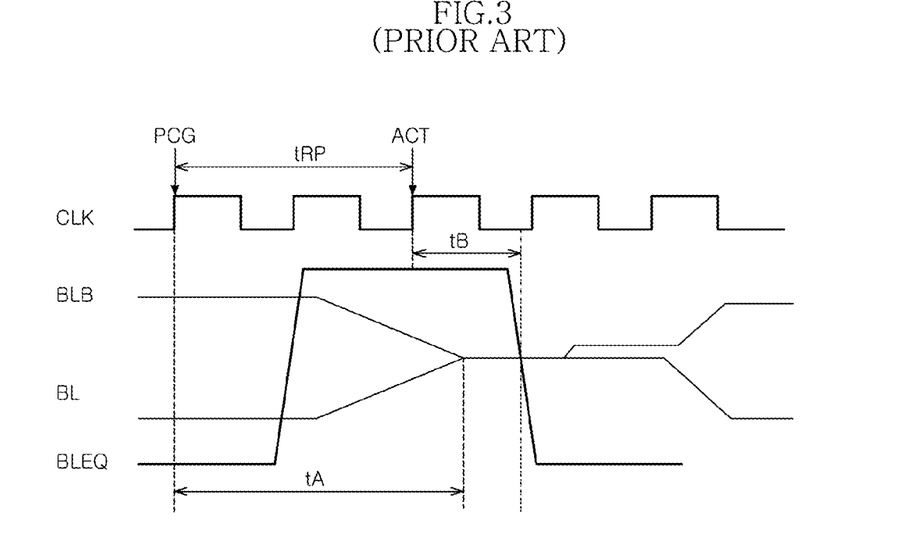
FIG. 3 is a timing diagram explaining a sensing operation of a semiconductor memory apparatus of FIG. 2.

FIG. 3 is a timing diagram explaining the sensing operation of the semiconductor memory apparatus of FIG. 2.

When the bit line BL and the bit line bar BLB are charged to a low level and a high level, respectively, the precharge signal PCG is inputted, and the bit line equalize signal BLEQ is enabled. Accordingly, the first and second precharge elements T_PCG1 and T_PCG2 and the equalize element T_EQ are turned on, and the bit line pair BL/BLB is gradually charged to the same level, that is, a precharge voltage.

In FIG. 3, a time required until the bit line pair BL/BLB is precharged after the precharge signal PCG and the bit line equalize signal BLEQ are enabled may be represented by tA, and a time required until the bit line equalize signal BLEQ is disabled after a word line active signal ACT is enabled may be represented by tB. In this case, a RAS (row address strobe) precharge time tRP expressed as tA-tB should satisfy a designated time range. The RAS precharge time refers to a time required until the bit line pair BL/BLB is charged to the same precharge voltage after the precharge signal PCG is is enabled.

For this operation, the bit line BL and the bit line bar BLB should reach the precharge voltage at the same time. In the semiconductor memory apparatus of FIG. 2, the memory cell array CA0 and the sacrifice memory cell array PCA0 have the same structure. Therefore, since the capacitances of the bit line pair are accurately matched, it is impossible to satisfy a required RAS precharge time tRP.

However, the sacrifice memory cell arrays PCA0 and PCA1 are simply used to adjust the bit line capacitance in the bit line sense amplifier BLSA, but are not used to store data or the like. Therefore, the sacrifice memory cell arrays PCA0 and PCA1 may decrease the net die.

In order to solve such a problem, the following method has been proposed: capacitors using a storage node are formed at both edges of the bank instead of the sacrifice memory cell arrays and used to match the capacitances of the bit line pair.

Figure 4:
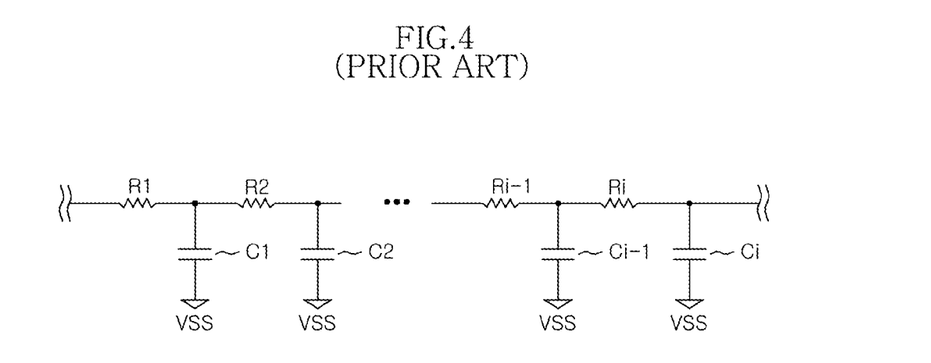
FIG. 4 illustrates a bit-line capacitance matching circuit.

FIG. 4 illustrates a bit-line capacitance matching circuit.

The bit-line capacitance matching circuit of FIG. 4 is coupled to the bit line sense amplifiers disposed at both edges of the bank.

That is, the bit line sense amplifiers disposed at both edges of the band should be coupled to a bit line and a bit line bar. When one of the bit line pair is a bit line or bit line bar extended from a memory cell array, the bit line capacitance matching circuit of FIG. 4 is formed in a bit line bar or bit line which is paired with the bit line or bit line bar.

Such a bit line capacitance matching circuit may be configured by using a storage node which is formed when a unit memory cell is formed.

When the capacitance matching circuit of FIG. 4 is configured to replace the sacrifice memory cell array PCA0 of FIG. 2, a positive capacitance corresponding to the bit line capacitance component 22 of the memory cell array CA0 is compensated by the capacitance matching circuit of FIG. 4.

However, a unit capacitance formed by using a storage node has a larger storage capacity than the unit capacity of a parasitic capacitance, and should use a plurality of capacitors C1 to Ci having a large capacity. Therefore, there is a limitation in matching the capacitances of the bit line pair. Furthermore, since the process is unstable during an initial process set-up, there are difficulties in adjusting a target capacitance value.

Figure 5:
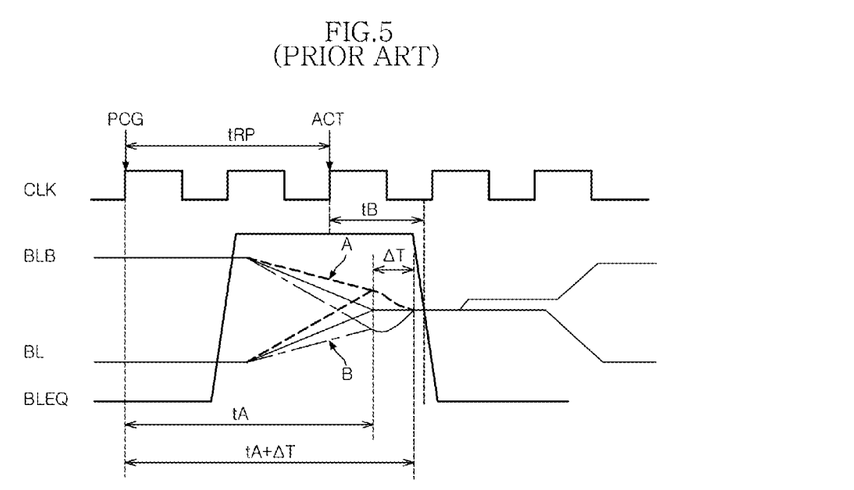
FIG. 5 is a timing diagram explaining a sensing operation of a semiconductor memory apparatus to which the bit line capacitance matching circuit of FIG. 4 is applied.

FIG. 5 is a timing diagram explaining a sensing operation of a semiconductor memory apparatus to which the bit line capacitance matching circuit of FIG. 4 is applied.

In a state where the bit line BL and the bit line bar BLB are charged to a low level and a high level, respectively, the precharge signal PCG is inputted and the bit line equalize signal BLEQ is enabled. Accordingly, the first and second precharge elements T_PCG1 and T_PCG2 and the equalize element T_EQ are turned on, and the bit line pair BL/BLB is gradually charged to the same level, that is, the precharge voltage.

However, although the capacitors having the same value as the bit lines forming a pair are inserted into the bit line capacitance matching circuit based on the calculated value, there may occur a capacitance difference between the bit line pair because the capacitors composing the capacitance matching circuit are formed by using the storage node.

As a result, the time required for equalizing the bit line pair to the same level may differ due to the capacitance mismatch between the bit line pair (refer to A or B of FIG. 5).

Accordingly, compared with the timing diagram of FIG. 3, the time required for equalizing the bit line pair increases by ΔT. This means that the time to required until the bit line pair reaches the precharge voltage VBLP after the precharge signal is enabled increases by ΔT. Furthermore, since the RAS precharge time tRP should be further secured by ΔT, the operation time of the semiconductor memory apparatus inevitably increases.

SUMMARY

In one embodiment of the present invention, a semiconductor memory apparatus comprises a bit line sense amplifiers; and a pair of precharge elements coupled in series between a first bit line and a second bit line and having an asymmetrical contact resistance ratio.

In another embodiment of the present invention, there is provided a bit line equalizing circuit which is coupled between first and second bit lines, and precharges the first and second bit lines to a preset voltage. The bit line equalizing circuit includes: a first precharge element coupled between the first bit line and a first precharge voltage supply line and driven in response to a bit line equalize signal; and a second precharge element coupled between a second precharge voltage supply line and the second bit line and driven in response to the bit line equalize signal. A ratio of a resistance value between the first bit line and the first precharge voltage supply line and a resistance value between the second bit line and the second precharge voltage supply line is set to a preset ratio.

In another embodiment of the present invention, a bit line equalizing device comprises a first and a second precharge elements forming over a semiconductor substrate; a first and a second junction regions forming in the semiconductor substrate such that the first and second junction regions are electrically coupled to the first precharge element; a third and a fourth junction regions forming in the semiconductor substrate such that the third and fourth junction regions are electrically coupled to the second precharge element; a first bit line contact to be electrically coupled to the first junction region; a second bit line contact to be electrically coupled to the fourth junction region, wherein a length ratio of the first and second bit line contacts is controlled to a preset ratio; a first bit line to be electrically coupled to the first bit line contact; and a second bit line to be electrically coupled to the second bit line contact.

In another embodiment of the present invention, a method for fabricating a bit line equalizing circuit includes the steps of: forming first and second precharge element over a semiconductor substrate; forming first and second junction regions in the semiconductor substrate such that the first and second junction regions are electrically coupled to the first precharge element, and forming third and fourth junction regions in the semiconductor substrate such that the third and fourth junction regions are electrically coupled to the second precharge element; forming a first bit line contact to be electrically coupled to the first junction region and forming a second bit line contact to be electrically coupled to the fourth junction region, wherein a length ratio of the first and second bit line contacts is controlled to a preset ratio; and forming a first bit line to be electrically coupled to the first bit line contact and a second bit line to be electrically coupled to the second bit line contact.

The second and third junction regions may be the same region, and the method may further include the steps of: forming a precharge contact to be electrically coupled to the second and third junction regions; and forming a precharge voltage supply line to be electrically coupled to the precharge contact. Furthermore, the second and third junction regions may be electrically isolated from each other, and the method may further include the steps of: forming a first precharge contact to be electrically coupled to the second junction region and a second precharge contact to be electrically coupled to the third junction region; and forming a first precharge voltage supply line to be electrically coupled to the first precharge contact and a second precharge voltage supply line to be electrically coupled to the second precharge contact. Furthermore, in the step of forming the first and second precharge contacts, a length ratio of the first and second precharge contacts may be controlled to a preset ratio.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a bit-line equalizing circuit according to embodiments of the present invention will be described below with reference to the accompanying drawings through example embodiments.

Figure 6:
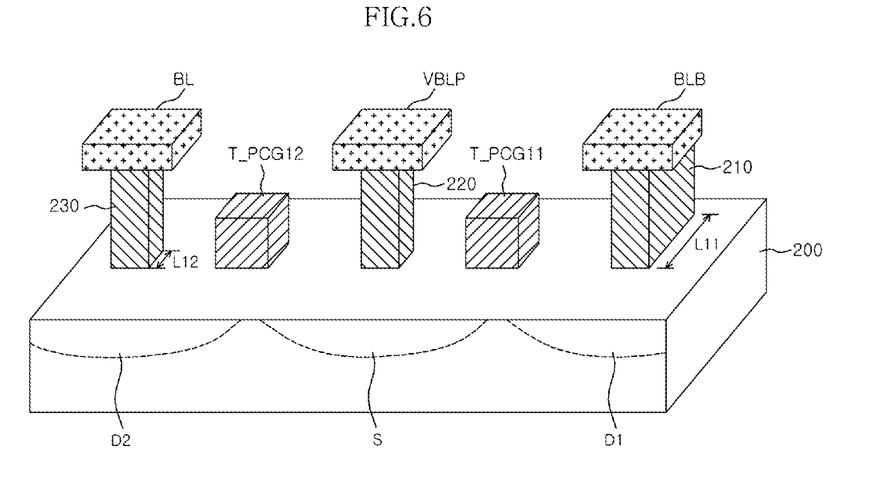
FIG. 6 illustrates a bit line equalizing circuit according to one embodiment.

FIG. 6 illustrates a bit line equalizing circuit according to one embodiment. FIG. 6 illustrates a bit line sense amplifier formed at both edges of a semiconductor memory apparatus having an open bit-line structure, including a pair of precharge elements which are electrically coupled to interconnections.

Referring to FIG. 6, the bit line equalizing circuit includes a pair of precharge elements T_PCG11 and T_PCG12, junction regions D1, S, and D2, a first bit line BLB, a second bit line BL, and a precharge power supply line VBLP. The junction regions D1, S, and D2 are formed in a semiconductor substrate at both sides of the precharge elements T_PCG11 and T_PCG12. The first bit line BLB is coupled to the first precharge element T_PCG11 through the first junction region D1 and a first bit line contact 210. The second bit line BL is coupled to the second precharge element T_PCG12 through the second junction region D2 and a second bit line contact 230. The precharge power supply line VBLP is coupled to the third junction region S as a common coupling node of the first and second precharge elements T_PCG11 and T_PCG12 through a precharge contact 220.

In such a bit line equalizing circuit, any one of the first and second bit lines BLB and BL is extended from a main memory cell array.

The bit line extended from the main memory cell array has a capacitance component, and resistors of the bit line contacts 210 and 230 may be asymmetrically formed to compensate for the capacitance component.

More specifically, drains D1 and D2 of the precharge elements T_PCG11 and T_PCG12 composing the bit line sense amplifier are coupled in series between the bit line BL and the bit line bar BLB. Therefore, the resistance values of the precharge elements are controlled in such a manner that a first charge time (RC time constant) and a second charge time are equalized to each other. The first charge time is decided (or set) by a resistor R11 of the precharge element T_PCG11 coupled to the first bit line BLB extended from the memory cell array, and a capacitance C11 existing in the first bit line BLB. The second charge time is decided by a resistor R12 of the precharge element T_PCG12 coupled to the second bit line BL and a capacitance C12 existing in the second bit line BL.

This may be accomplished by controlling a length L11 of the first bit line contact 210 and a length L12 of the second bit line contact 230.

Figure 7:
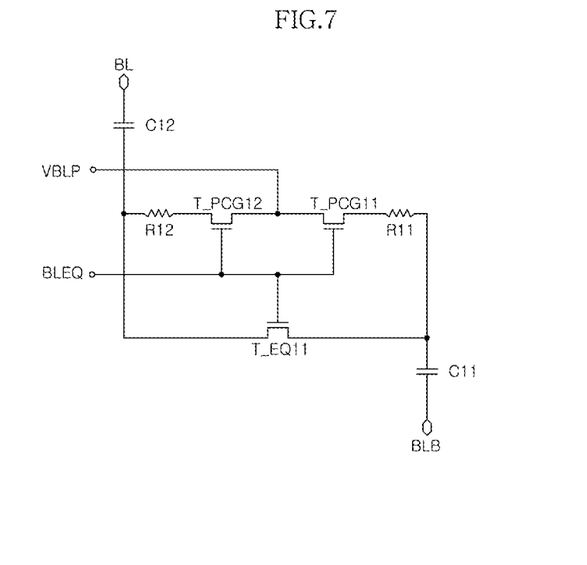
FIG. 7 is an equivalent circuit diagram of the bit line equalizing circuit of FIG. 6.

FIG. 7 is an equivalent circuit diagram of the bit line equalizing circuit of FIG. 6.

The RC time constant of the first bit line BLB is decided according to $\tau 1 = R11*C11$, and the RC time constant of the second bit line BL is decided according to $\tau 2 = R12*C12$. Therefore, as the resistance value of the resistor R11 or R12 is controlled in such a manner that $\tau 1$ is equalized to $\tau 2$, the bit line pair reaches the precharge voltage level at the same time.

In FIG. 7, T_EQ11 represents an equalizing transistor.

When a precharge command is applied and the bit line equalizing signal BLEQ is enabled, the first and second precharge elements T_PCG11 and T_PCG12 and the equalizing transistor T_EQ11 are turned on.

As the precharge voltage is supplied to the common coupling node S of the precharge elements T_PCG11 and T_PCG12 through the precharge power supply line VBLP, the first and second bit lines BLB and BL start to be precharged. In particular, since the resistance values of the first precharge element T_PCG11 coupled to the first bit line BLB and the second precharge element T_PGC12 coupled to the second bit line BL are controlled according to the ratio of the contact lengths L11 and L12 such that R11*C11 is equalized to R12*C12, the first and second bit lines BLB and BL reach the precharge voltage level at the same time.

In the conventional semiconductor memory apparatus having an open bit-line structure, the bit line sense amplifiers at both outermost edges require a bit line paired with a bit line extended from the main memory cell. Therefore, a sacrifice memory cell array or a capacitor using a storage node is used to match bit line capacitances. However, when the sacrifice memory cell array is used, the net die may be decreased, and when the storage node is used to adjust the capacitances, a calculated value may differ from a capacitance during an actual operation, and capacitances cannot be accurately matched because the storage node has a large capacity unit.

According to an embodiment of the present invention, however, when the resistance values of the precharge elements are controlled in such a manner that the pair of bit lines reach the precharge voltage level at the same time, the decrease of the net die may be prevented, and the capacitance may be accurately adjusted, which makes it possible to guarantee the operational reliability of the semiconductor memory apparatus.

In an embodiment of the present invention, it has been described that the precharge power supply line is commonly coupled to the common coupling node of the pair of precharge elements. However, the present invention is not limited thereto.

Figure 8:
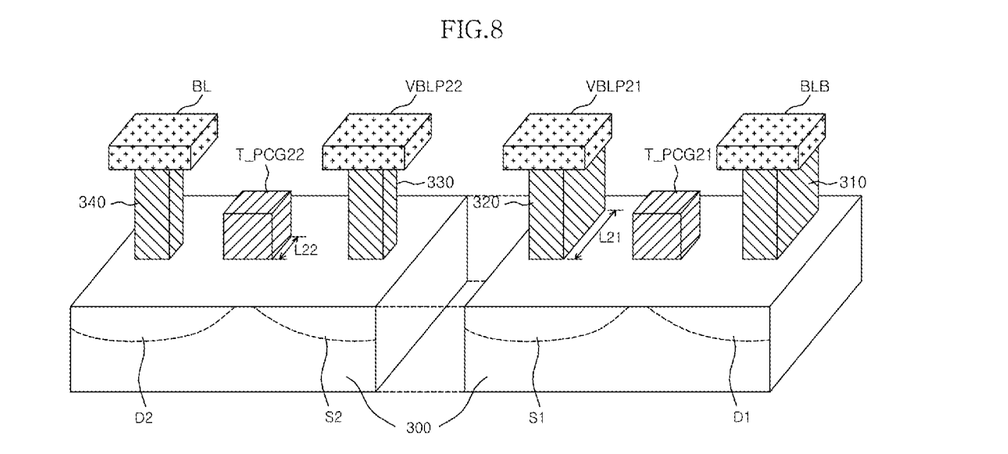
FIG. 8 illustrates a bit line equalizing circuit according to is another embodiment.
Figure 9:
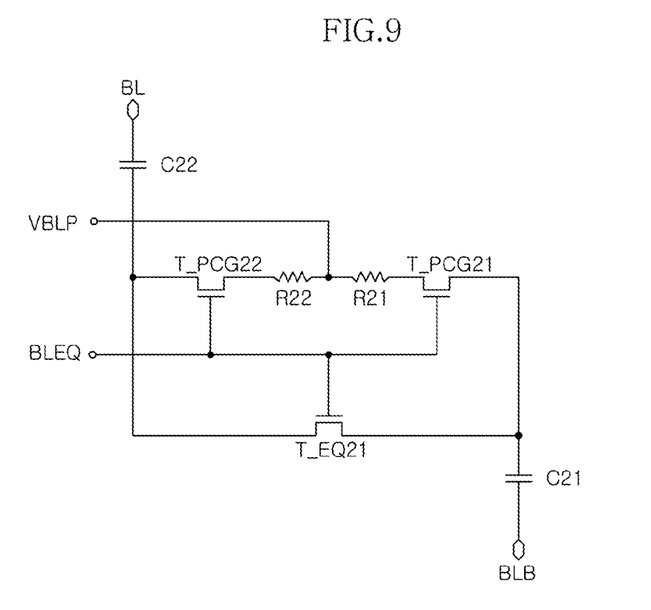
FIG. 9 is an equivalent circuit diagram of the bit line equalizing circuit of FIG. 8.

FIG. 8 illustrates a bit line equalizing circuit according to another embodiment. FIG. 9 is an equivalent circuit diagram of the bit line equalizing circuit of FIG. 8.

Referring to FIG. 8, the bit line equalizing circuit according to an embodiment does not share a precharge power supply line.

More specifically, a first precharge element T_PCG21 is formed over a semiconductor substrate 300, and junction regions D1 and D2 are formed so as to be electrically coupled to the first precharge element T_PCG21. A first bit line BLB is coupled to the first precharge element T_PCG21 through the first bit line contact 310 and the first junction region D1. A first precharge power supply line VBLP21 is coupled to the first precharge element T_PCG21 through the first precharge contact 320 and the second junction region S1.

Meanwhile, a second precharge element T_PCG22 is formed over the semiconductor substrate 300 so as to be electrically isolated from the first precharge element T_PCG21. Junction regions D2 and S2 are formed so as to be electrically coupled to the second precharge element T_PCG22. A second bit line BL is coupled to the second precharge element T_PCG22 through a second bit line contact 340 and the third junction region D2. A second precharge power supply line VBLP22 is coupled to the second precharge element T_PCG22 through a second precharge contact 330 and the fourth junction region S2.

In the bit line sense amplifier having such a structure, a ratio of the length L21 of the first precharge contact 320 to the length L22 of the second precharge contact 330 may be controlled to match the capacitances of the bit line pair.

Referring to FIG. 9, it can be seen that a time to reach the precharge voltage level by a capacitance component C21 existing in the first bit line BLB and a time to reach the precharge voltage level by a capacitance component C22 existing in the second bit line BL may be equalized by controlling the length ratio of the first and second precharge contacts 320 and 330.

In FIGS. 8 and 9, it has been described that when the pair of precharge elements T_PCG21 and T_PCG22 do not share the precharge power supply lines VBLP21 and VBLP22, the capacitances are matched by controlling the length ratio of the precharge contacts 320 and 330, but the present invention is not limited thereto.

That is, when the pair of precharge elements T_PCG21 and T_PCG22 do not share the precharge voltage supply lines VBLP21 and VBLP22, the length ratio of the precharge contacts 320 and 330 and the length ratio of the first and second bit line contacts 310 and 340 may be controlled together, or only the length ratio of the first and second bit line contacts 310 and 340 may be controlled to match the capacitances.

In the semiconductor memory apparatus having an open bit-line structure, the resistance ratio of the precharge elements is symmetrically set for the bit line sense amplifiers coupled to the bit line and the bit line bar from two cell arrays adjacent to each other.

However, the resistance ratio of the precharge elements is asymmetrically set for the bit line sense amplifiers formed at both edges, in order for the capacitance matching with the bit line extended from the memory cell array. At this time, considering the capacitance components existing in the bit line pair coupled to the respective bit line sense amplifiers, the resistance ratio of the precharge elements may be decided in such a manner that the bit line pair reaches the precharge voltage level at the same time.

Accordingly, since a sacrifice memory cell array does not need to be disposed at the edges of the bank, it is possible to prevent the decrease of the net die. Furthermore, since the capacitances are matched by changing the contact resistance, the capacitance matching may be performed more precisely than when the store node is used to match the capacitances. Therefore, it is possible to improve the operation reliability of the semiconductor memory apparatus.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising a first bit line sense amplifier unit coupled between a first bit line and a second bit line; and
   a pair of precharge elements coupled in series between the first bit line and the second bit line and having an asymmetrical contact resistance ratio,
   wherein the pair of precharge elements comprises a first precharge element and a second precharge element, and the contact resistance ratio is set so that a first charge time and a second charge time are equalized to each other,
      wherein the first charge time is decided by a first contact resistance of the first precharge element coupled to the first bit line, and a capacitance existing in the first bit line, and
      the second charge time is decided by a second resistance of the second precharge element coupled to the second bit line, and a capacitance existing in the second bit line.

2. The semiconductor memory apparatus according to claim 1, wherein the pair of precharge elements comprises:
   the first precharge element coupled between the first bit line and a first precharge voltage supply line and driven in response to a bit line equalize signal; and
   the second precharge element coupled between a second precharge voltage supply line and the second bit line and driven in response to the bit line equalize signal,
   wherein a ratio of the first contact resistance to the second contact resistance is different.

3. The semiconductor memory apparatus according to claim 2, wherein the first precharge element comprises:
   a first junction region coupled to the first bit line through a first bit line contact and a second junction region coupled to a precharge voltage supply line through a first precharge contact and is driven in response to the bit line equalize signal, and
   the second precharge element comprises a third junction region coupled to the precharge voltage supply line through a second precharge contact and a fourth junction region coupled to the second bit line through a second bit line contact and is driven in response to the bit line equalize signal,
   wherein the asymmetrical contact resistance ratio is set according to a ratio of a length of the first bit line contact and a length of the second bit line contact.

4. The semiconductor memory apparatus according to claim 3, wherein the second junction region and the third junction region are the same junction region, and the first precharge contact and the second precharge contact are the same contact.

5. The semiconductor memory apparatus according to claim 3, wherein the second junction region and the third junction region are electrically isolated from each other, the first precharge contact and the second precharge contact are electrically isolated from each other, and the asymmetrical contact resistance ratio is set according to the ratio of the length of the first bit line contact to the length of the second bit line contact and the ratio of the length of the first precharge contact to the length of the second precharge contact.

6. The semiconductor memory apparatus according to claim 2, wherein the first precharge element comprises:

a first junction region coupled to the first bit line through a first bit line contact and a second junction region coupled to a precharge voltage supply line through a first precharge contact, and is driven in response to the bit line equalize signal, and the second precharge element comprises a third junction region coupled to the precharge voltage supply line through a second precharge contact and a fourth junction region coupled to the second bit line through a second bit line contact, and is driven in response to the bit line equalize signal, wherein the second junction region and the third junction region are electrically isolated from each other, the first precharge contact and the second precharge contact are electrically isolated from each other, and the asymmetrical contact resistance ratio is set according to a ratio of a length of the first precharge contact and a length of the second precharge contact.

7. The semiconductor memory apparatus according to claim 1, further comprising one or more banks each comprising one or more memory cell arrays arranged in a line, and
the first bit line sense amplifier unit is disposed at both edges of the bank.

8. The semiconductor memory apparatus according to claim 7, further comprising one or more second bit line sense amplifier units each comprising one or more second bit line sense amplifiers arranged between the pair of memory cell arrays adjacent to each other and coupled between first and second bit lines extended from the pair of memory cell arrays, respectively.

9. The semiconductor memory apparatus according to claim 8, wherein each of the one or more second bit line sense amplifiers comprises a pair of precharge elements coupled in series between the first and second bit lines extended from the pair of memory cell arrays adjacent each other, respectively, and having a symmetrical contact resistance ratio.

10. A bit line equalizing circuit which is coupled between first and second bit lines, and precharges the first and second bit lines to a preset voltage, the bit line equalizing circuit comprising:

a first precharge element coupled between the first bit line and a first precharge voltage supply line and driven in response to a bit line equalize signal; and a second precharge element coupled between a second precharge voltage supply line and the second bit line and driven in response to the bit line equalize signal, wherein a ratio of a resistance value between the first bit line and the first precharge voltage supply line and a resistance value between the second bit line and the second precharge voltage supply line is set so that a first charge time and a second charge time are equalized to each other, wherein the first charge time is decided by a first contact resistance of the first precharge element coupled to the first bit line, and a capacitance existing in the first bit line, and the second charge time is decided by a second resistance of the second precharge element coupled to the second bit line, and a capacitance existing in the second bit line.

11. The bit line equalizing circuit according to claim 10, wherein the first precharge element is coupled to the first bit line through a first bit line contact, the second precharge element is coupled to the second bit line through a second bit line contact, and the ratio of the resistance values is set according to a length of the first bit line contact and a length of the second bit line contact.

12. The semiconductor memory apparatus according to claim 10, wherein the first precharge voltage supply line and the second precharge voltage supply line are the same voltage supply line.

13. The semiconductor memory apparatus according to claim 10, wherein the first precharge element is coupled to the first precharge voltage supply line through a first precharge contact, the second precharge element is coupled to the second precharge voltage supply line through a second precharge contact which is electrically isolated from the first precharge contact, and the ratio of the resistance values is set according to a length of the first precharge contact and a length of the second precharge contact.

14. The semiconductor memory apparatus according to claim 13, wherein the ratio of the resistance values is set according to the lengths of the first and second bit line contacts and the lengths of the first and second precharge contacts.

* * * * *